United States Patent
Rasouli et al.

(10) Patent No.: US 9,673,786 B2
(45) Date of Patent: Jun. 6, 2017

(54) FLIP-FLOP WITH REDUCED RETENTION VOLTAGE

(71) Applicant: QUALCOMM Incorporated, San Diego, CA (US)

(72) Inventors: Seid Hadi Rasouli, San Diego, CA (US); Animesh Datta, San Diego, CA (US); Jay Madhukar Shah, Bangalore KRN (IN); Martin Saint-Laurent, Austin, TX (US); Peeyush Kumar Parkar, Bangalore KRN (IN); Sachin Bapat, Bangalore KRN (IN); Ramaprasath Vilangudipitchai, San Diego, CA (US); Mohamed Hassan Abu-Rahma, Mountain View, CA (US); Prayag Bhanubhai Patel, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 688 days.

(21) Appl. No.: 13/862,015

(22) Filed: Apr. 12, 2013

(65) Prior Publication Data
US 2014/0306735 A1  Oct. 16, 2014

(51) Int. Cl.
*H03K 3/02* (2006.01)
*H03K 3/289* (2006.01)
(Continued)

(52) U.S. Cl.
CPC ......... *H03K 3/012* (2013.01); *H03K 3/35625* (2013.01); *H03K 3/356008* (2013.01)

(58) Field of Classification Search
CPC ............... H03K 3/012; H03K 3/35625; H03K 3/356156; H03K 3/0375; H03K 3/0372;
(Continued)

(56) References Cited

U.S. PATENT DOCUMENTS

| | | | |
|---|---|---|---|
| 4,656,649 A * | 4/1987 | Takahashi | ........................ 377/48 |
| 5,015,875 A | 5/1991 | Giles et al. | |

(Continued)

FOREIGN PATENT DOCUMENTS

JP  58210715 A  12/1983

OTHER PUBLICATIONS

International Search Report and Written Opinion—PCT/US2014/033051—ISA/EPO—Oct. 2, 2014.
(Continued)

*Primary Examiner* — Daniel D Chang
(74) *Attorney, Agent, or Firm* — Chui-kiu Teresa Wong; Kenneth Vu

(57) ABSTRACT

A circuit including a logic gate responsive to a clock signal and to a control signal. The circuit also includes a master stage of a flip-flop. The circuit further includes a slave stage of the flip-flop responsive to the master stage. The circuit further includes an inverter responsive to the logic gate and configured to output a delayed version of the clock signal. An output of the logic gate and the delayed version of the clock signal are provided to the master stage and to the slave stage of the flip-flop. The master stage is responsive to the control signal to control the slave stage.

26 Claims, 7 Drawing Sheets

(51) Int. Cl.
*H03K 19/00* (2006.01)
*H03K 3/012* (2006.01)
*H03K 3/356* (2006.01)
*H03K 3/3562* (2006.01)

(58) Field of Classification Search
CPC ....... H03K 3/356008; H03K 3/356121; H03K 3/356173; H03K 3/3562; H03K 3/356104; H03K 19/0963; H03K 17/693; H03K 19/0013; H03K 19/0016
USPC .... 326/56–58, 81–87, 93–98, 112, 119, 121; 327/199, 200, 202, 203, 208–212, 218, 327/198
See application file for complete search history.

(56) References Cited

U.S. PATENT DOCUMENTS

| | | | |
|---|---|---|---|
| 5,719,878 A * | 2/1998 | Yu et al. | 714/726 |
| 7,123,068 B1 * | 10/2006 | Hoover et al. | 327/202 |
| 7,138,842 B2 * | 11/2006 | Padhye et al. | 327/203 |
| 7,583,121 B2 * | 9/2009 | Berzins et al. | 327/202 |
| 7,768,331 B1 | 8/2010 | Biyani | |
| 2005/0242862 A1 * | 11/2005 | Won et al. | 327/218 |
| 2006/0273837 A1 | 12/2006 | Shimazaki et al. | |
| 2007/0001729 A1 * | 1/2007 | Branch et al. | 327/202 |
| 2008/0218233 A1 * | 9/2008 | Yamamoto et al. | 327/198 |
| 2008/0218234 A1 * | 9/2008 | Jain | 327/202 |
| 2011/0298517 A1 | 12/2011 | Pal | |

OTHER PUBLICATIONS

Partial International Search Report—PCT/US2014/033051—ISA/EPO—Jul. 2, 2014.

* cited by examiner

FLIP-FLOP WITH REDUCED RETENTION VOLTAGE

I. FIELD

The present disclosure is generally related to flip-flops.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

In mobile devices, battery life is a feature that can distinguish one brand from other brands. In a mobile device, one of the sources of energy consumption is standby power (i.e., the energy consumed when the mobile device is in a standby mode, or when certain components of the device are stalled in the background). When a mobile device is in the standby mode, the mobile device turns off particular circuits of the mobile device to conserve battery life. However, some logic states (e.g., control information) of the particular circuits must be retained during the standby mode in order for the mobile device to function properly when the mobile device exits the standby mode. Flip-flop circuits are typically used to retain the logic states during the standby mode. The flip-flop circuits consume power during the standby mode.

To reduce power of flip-flop circuits, existing systems generally reduce retention voltage (e.g., voltage supplied to a flip-flop circuit during the standby mode) by using a specific type of flip-flop (i.e., retention flip-flops). While retention flip-flops are able to operate at lower voltages, retention flip-flops typically increase area overhead, limiting their applications.

III. SUMMARY

A retention flip-flop consumes power during a retention operation mode. Thus, a retention flip-flop within a mobile device has an impact on battery life of the mobile device. Systems and methods described herein may advantageously enable a retention flip-flop to reduce power consumption.

For example, a conventional reset flip-flop (e.g., a retention flip-flop) typically includes a master stage and a slave stage. The slave stage may include a pass gate, an inverter, a plurality of nMOS transistors, and a plurality of pMOS transistors. During a retention operation mode, a supply voltage to the reset flip-flop is lowered so that transistors in the reset flip-flop do not switch states (thus retaining states of the transistors prior to entering into the retention operation mode). However, each reset transistor consumes power during the retention operation mode due to leakage current associated with the reset transistor. When the supply voltage is lowered to a level that is less than the leakage current consumed by a reset transistor during the retention operation mode, the reset transistor may lose the states. Loss of transistor states may cause data corruption.

In a particular embodiment, a reset flip-flop may control a master stage and a slave stage using a delayed version of a clock signal and an inverted delayed version of the clock signal. The delayed version of the clock signal and the inverted delayed version of the clock signal may be generated via a NOR logic gate and an inverter. By avoiding the use of a reset transistor from the slave stage (and avoiding the leakage current from the reset transistor), the reset flip-flop may reduce power consumption during a retention operation mode.

In another particular embodiment, the reset flip-flop includes a master stage, a slave stage coupled to the master stage, and an inverter coupled to a reset signal input. The slave stage includes a NAND logic gate and the NAND logic gate is coupled to the inverter.

In another particular embodiment, a reset flip-flop may control a master stage and a slave stage using a delayed version of a clock signal and an inverted delayed version of the clock signal. The delayed version of the clock signal and the inverted delayed version of the clock signal may be generated via a NOR logic gate and an inverter. The reset flip-flop may be responsive to a set signal input coupled to an inverter. The reset flip-flop may also have a NAND logic gate in the master stage.

In a particular embodiment, a circuit includes a NOR logic gate responsive to a clock signal and to a control signal. The circuit also includes a master stage of a flip-flop. The circuit further includes a slave stage of the flip-flop that is responsive to the master stage. The circuit further includes an inverter that is responsive to the NOR logic gate and configured to output a delayed version of the clock signal. An output of the NOR logic gate and the delayed version of the clock signal are provided to the master stage and to the slave stage of the flip-flop. The master stage is responsive to the control signal to control the slave stage In another particular embodiment, a circuit includes a master stage of a flip-flop. The circuit also includes a slave stage of the flip-flop that is responsive to the master stage. The flip-flop is in a single power domain. The master stage is configured to provide a high-impedance output to an input of the slave stage during a retention operation mode.

In a particular embodiment, a method includes selectively gating a clock signal at a first input of a NOR logic gate with a control signal at a second input of the NOR logic gate to generate a selectively gated inverted version of the clock signal at an output of the NOR logic gate. The method also includes generating a selectively gated version of the clock signal. The method further includes providing the selectively gated inverted version of the clock signal and the selectively gated version of the clock signal to a master stage of a flip-flop and to a slave stage of the flip-flop.

In another particular embodiment, a method includes providing an output of a master stage of a flip-flop to an input of a slave stage of the flip-flop during a normal operating mode. The flip-flop is in a single power domain. The method also includes providing a high-impedance output to the input of the slave stage during a retention operation mode.

One particular advantage provided by at least one of the disclosed embodiments is the ability to reduce retention voltage of a reset flip-flop and thus to save energy and extend battery life. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
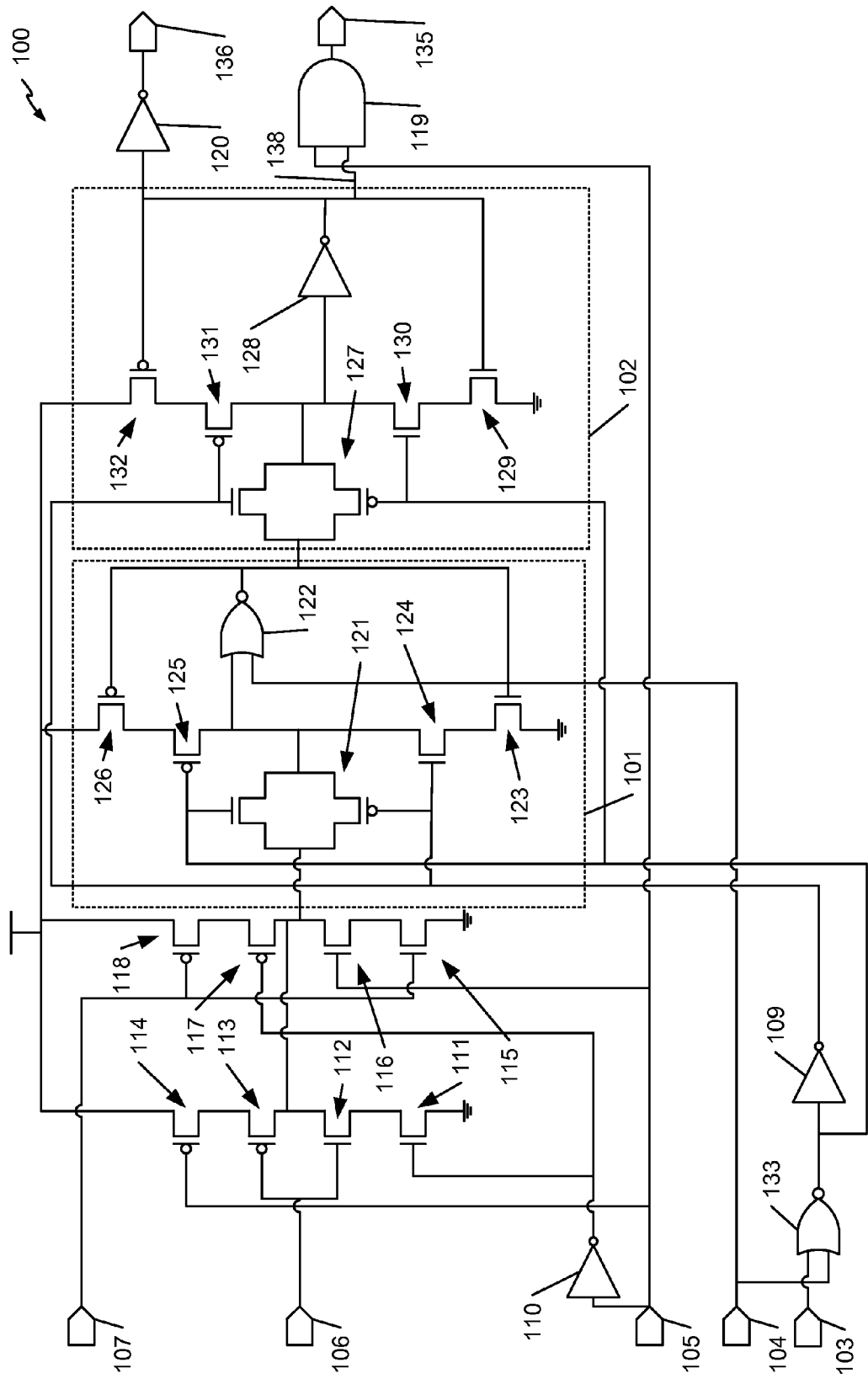
FIG. 1 is a logic diagram illustrating a particular embodiment of an asynchronous reset flip-flop.

FIG. 1 illustrates an asynchronous reset flip-flop 100. The asynchronous reset flip-flop 100 may include a master stage 101 and a slave stage 102. The asynchronous reset flip-flop 100 may be configured to receive a clock signal 103, a control signal 104, and control signals 105-107. The asynchronous reset flip-flop 100 may further include transistors 111-118, inverters 109, 110, and 120, a NAND logic gate 119, signal outputs 135, 136, and a NOR logic gate 133. The transistors 111-114 may form a first transistor stack and the transistors 115-118 may form a second transistor stack. The two four-transistor stacks 111-118 may be responsive to the control signals 105-107 to provide an output to the master stage 101.

The master stage 101 may include a pass gate 121, a NOR logic gate 122, two n-channel metal-oxide semiconductor (nMOS) transistors 123 and 124, and two p-channel metal-oxide semiconductor (pMOS) transistors 125 and 126. An input of the pass gate 121 may be coupled to an output of the two four-transistor stacks 111-118, and an output of the pass gate 121 may be coupled to an input of a latch formed by the transistors 126 and 123 and the NOR logic gate 122. The nMOS transistor 124 and the pMOS transistor 125 may operate as isolation devices to reduce contention during latching of data received via the pass gate 121. The NOR logic gate 122 may have a first input coupled to the output of the pass gate 121 and a second input coupled to the control signal 104. An output of the NOR logic gate 122 may provide an output signal of the master stage 101 to a pass gate 127 (e.g., a transmission gate) of the slave stage 102 and to the nMOS transistor 123 and to the pMOS transistor 126. The NOR logic gate 122 and the transistors 123-126 may operate to latch a data value at an output of the master stage 101 when the control signal 104 is a logical zero and to output a logical zero value when the control signal 104 is a logical one.

The slave stage 102 may include the pass gate 127, an inverter 128, nMOS transistors 129, 130 and pMOS transistors 131, 132. The pass gate 127 may have an input responsive to an output of the NOR gate 122 of the master stage 101 and may have an output coupled to an input of a latch formed from the inverter 128 and the nMOS transistor 129 and the pMOS transistor 132. The nMOS transistor 130 and the pMOS transistor 131 may operate as isolation devices to reduce contention during latching of data received via the pass gate 127.

An output of the inverter 128 may be coupled to one input of the NAND logic gate 119 and the control signal 105 may be coupled to a second input of the NAND logic gate 119. An output of the NAND logic gate 119 may be coupled to the signal output 135. The output of the inverter 128 may be coupled to an input of the inverter 120 and an output of the inverter 120 may be coupled to the signal output 136.

The master stage 101 may be coupled to the control signals 105-107 through the first transistor stack, the second transistor stack, and the inverter 110. The slave stage 102 may be coupled to the master stage 101 at an output of the NOR logic gate 122. The slave stage 102 may be coupled to the signal outputs 135 and 136 through the NAND logic gate 119 and the inverter 120. The pass gate 121 of the master stage 101 and the pass gate 127 of the slave stage 102 may be coupled to the clock signal input 103 via the NOR logic gate 133 and the inverter 109.

The NOR logic gate 133 may be responsive to the clock signal 103 and to the control signal 104 to generate a selectively gated inverted delayed version of the clock signal 103. The NOR logic gate 133 may provide clock gating of the clock signal 103 via the control signal 104 due to the output of the NOR logic gate 133 depending on both the clock signal 103 and the control signal 104. The inverter 109 may be responsive to the NOR logic gate 133 and may be configured to output a delayed version of the clock signal 103 (and the signal may be gated by the control signal 104). An output of the NOR logic gate 133 (e.g., the selectively gated inverted version of the clock signal 103) and the delayed version of the clock signal 103 may be provided to the master stage 101 and to the slave stage 102 of the asynchronous reset flip-flop 100. When the control signal 104 is a reset signal, the master stage 101 may be responsive to the reset input (via the NOR logic gate 122) to reset the master stage 101 in a reset mode. The master stage 101 is configured to reset the slave stage 102 in the reset mode. The slave stage 102 may be isolated from the control signal 104 (e.g., the slave stage 102 is not connected to the control signal 104). In a particular embodiment, the asynchronous reset flip-flop 100 includes no more than two transmission gates.

During operation, when the control signal 104 is a logic zero, the control signal 106 is received at the master stage 101 via the first transistor stack and via the second transistor stack that are responsive to the control signal inputs 105-107 (and to an output of the inverter 110 that provides an inverted version of the control signal 105). The control signal 106 is latched into the master stage 101 while the clock signal 103 is a logic zero and an inverted version of the control signal 106 is held at the output of the master stage 101 while the clock signal is a logic one. The output of the master stage 101 may be latched into the slave stage 102 while the clock signal 103 is a logic one and an inverted version of the output of the master stage 101 may be held at an output 138 of the slave stage 102 when the clock signal 103 is a logic zero.

When the control signal 104 is a logic one, the NOR logic gate 122 in the master stage 101 may output a logical low value (e.g., a logic zero) that is independent of the control signals 105-107 and independent of the clock signal 103.

The NOR logic gate 133 may hold an output of the NOR logic gate 133 to a logic zero, causing the pass gate 127 in the slave stage 102 to remain in a pass-though state and to isolate the input of the inverter 128 from the supply voltage and ground via the transistors 130 and 131. Because the output of the master stage 101 may remain at a logic low value when the control signal 104 is a logic one, the output 138 of the slave stage 102 may be reset to a logic one during a reset operation.

In a particular embodiment, the output of the NOR logic gate 133 is configured to be provided to multiple flip-flop circuits. For example, the NOR logic gate 133 and the inverter 109 of the clock path may be coupled to multiple reset flip flops (i.e., multiple pairs of master portions and slave portions).

By utilizing the NOR logic gate 133 to control the input to the inverter 128 by holding the pass gate 127 in a pass-through state during a reset mode, the asynchronous reset flip-flop 100 does not use a reset transistor in the slave stage 102 to control the input to the inverter 128 (as in a conventional asynchronous reset flip-flop). By avoiding use of a reset transistor, a current associated with the reset transistor is also avoided. Thus, the asynchronous reset flip-flop 100 may enable a retention flip-flop (e.g., a reset flip-flop) to reduce leakage current. Reducing leakage current reduces overall power consumption of the retention flip-flop.

Figure 2:
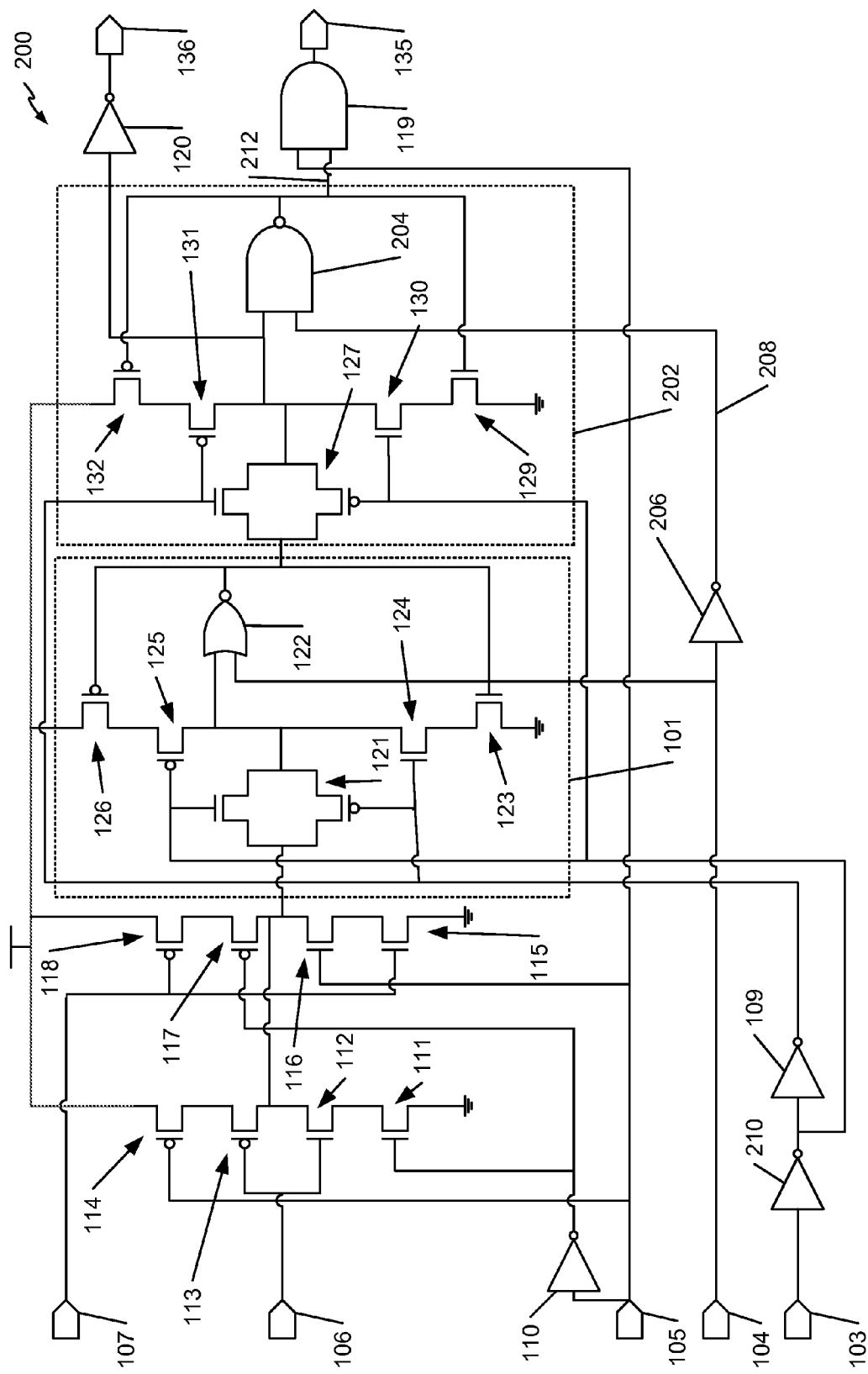
FIG. 2 is a logic diagram illustrating another particular embodiment of an asynchronous reset flip-flop.

FIG. 2 illustrates another particular embodiment of an asynchronous reset asynchronous reset flip-flop 200. Compared to the asynchronous reset flip-flop 100 of FIG. 1, the asynchronous reset flip-flop 200 replaces the inverter 128 of FIG. 1 with a NAND logic gate 204 in the slave stage 202 and replaces the NOR logic gate 133 with an inverter 210. The asynchronous reset flip-flop 200 may include the master stage 101 of FIG. 1 and a slave stage 202 that is responsive to the master stage 101. The slave stage 202 may include the NAND logic gate 204 that may be responsive to an output of the master stage 101 and to a reset signal (via a reset path 208 that may include the control signal 104 and an inverter 206). The NAND logic gate 204 may be responsive to the inverter 206 on the reset path 208. The inverter 210 may be responsive to the clock signal 103.

When the control signal 104 is a reset signal, the NAND logic gate 204 may be configured to function as an inverter during a normal operation mode (i.e., the slave stage 202 is not reset by the master stage 101) and to perform a reset function during a reset operation mode (e.g., the slave stage 202 is reset by the control signal 104 via the reset path 208). When the control signal 104 is a logic zero, the asynchronous reset flip-flop 200 may be in the normal operation mode. The NAND logic gate 204 may output an inverted version of an input signal received at the slave stage 202 from the master stage 101. When the control signal 104 is a logic one, the asynchronous reset flip-flop 200 may be in a reset mode, and the NAND logic gate 204 may output a logic one.

Although the inverter 206 is added in the reset path 208, the area overhead, especially in flop trays where the output of the inverter 206 can be provided to several flip-flops, is reduced as compared to a conventional asynchronous reset flip-flop. In the asynchronous reset flip-flop 200, the keeper feedback (of the transistors 131, 132) may be stronger as compared to a conventional asynchronous reset flip-flop that employs more than two transistors as keeper transistors.

By utilizing the NAND logic gate 204 to control an output 212 of the slave stage 202 during a reset mode, the asynchronous reset flip-flop 200 does not use a reset transistor in the slave stage 202 to control the output 212 of the slave stage 202 (as in a conventional asynchronous reset flip-flop). A leakage current associated with the reset transistor is avoided.

To further reduce power consumption of the asynchronous reset flip-flop 200, the width of the pMOS transistors 131 and 132 may be increased. For example, the output of the pass gate 127 may be coupled to the two serially coupled pull-down transistors 129 and 130, and a width of the two serially coupled pull-up transistors 131 and 132 may be larger than a width of the two serially coupled pull-down transistors 129 and 130. Through this technique, the total circuit area of the asynchronous reset flip-flop 200 may remain substantially unchanged even though the area of the pMOS transistors 131 and 132 is increased. In a particular embodiment, the retention voltage of the asynchronous reset flip-flop 200 is reduced by about 20 mV when the width of the transistors 131 and 132 is increased by 30 nanometers (nm) from 110 nm to 140 nm. In another particular embodiment, when the size of the transistors 131 and 132 is increased by 30%, the retention voltage of the asynchronous reset flip-flop 200 is reduced by an additional 30 mV. To further reduce power consumption of the asynchronous reset flip-flop 200, a width of the nMOS transistors 129 and 130 may be decreased, such as to a minimum width achievable by a fabrication technique. For example, a width of the two serially-coupled transistors 129 and 130 may be approximately equal to a minimum width permitted by a fabrication rule.

It should be understood that the two preceding embodiments (the asynchronous reset flip-flop 100 of FIG. 1 and the asynchronous reset flip-flop 200), or aspects of such embodiments, can be combined with other design and/or process techniques. In a particular embodiment, a high threshold voltage reset transistor is used in the slave stage 202. In another particular embodiment, the pull-down nMOS transistors 129 and 130 are replaced with high threshold voltage transistors.

In a particular embodiment, to further reduce power consumption of the asynchronous reset flip-flop 200, the transmission gate 121 of the master stage 101 is replaced by a tri-state inverter. Alternatively, an additional input signal (not shown) may be added to the master stage 101 such that the input signal forces the master stage 101 to output a logic one during the retention mode. Adding the tri-state inverter or the additional input signal may reduce the retention voltage of the asynchronous reset flip-flop 200 by about 15 mV.

In a particular embodiment, two reset transistors (not shown) are used in the slave stage 202 to reduce leakage current since a probability of leakage in two serially coupled reset transistors in a fast corner (due to process variations) is lower than that in a single reset transistor as is typically used in a conventional asynchronous reset flip-flop. Adding two serially coupled reset transistors instead of a single reset transistor may reduce the retention voltage of the asynchronous reset flip-flop by about 20 mV.

Figure 3:
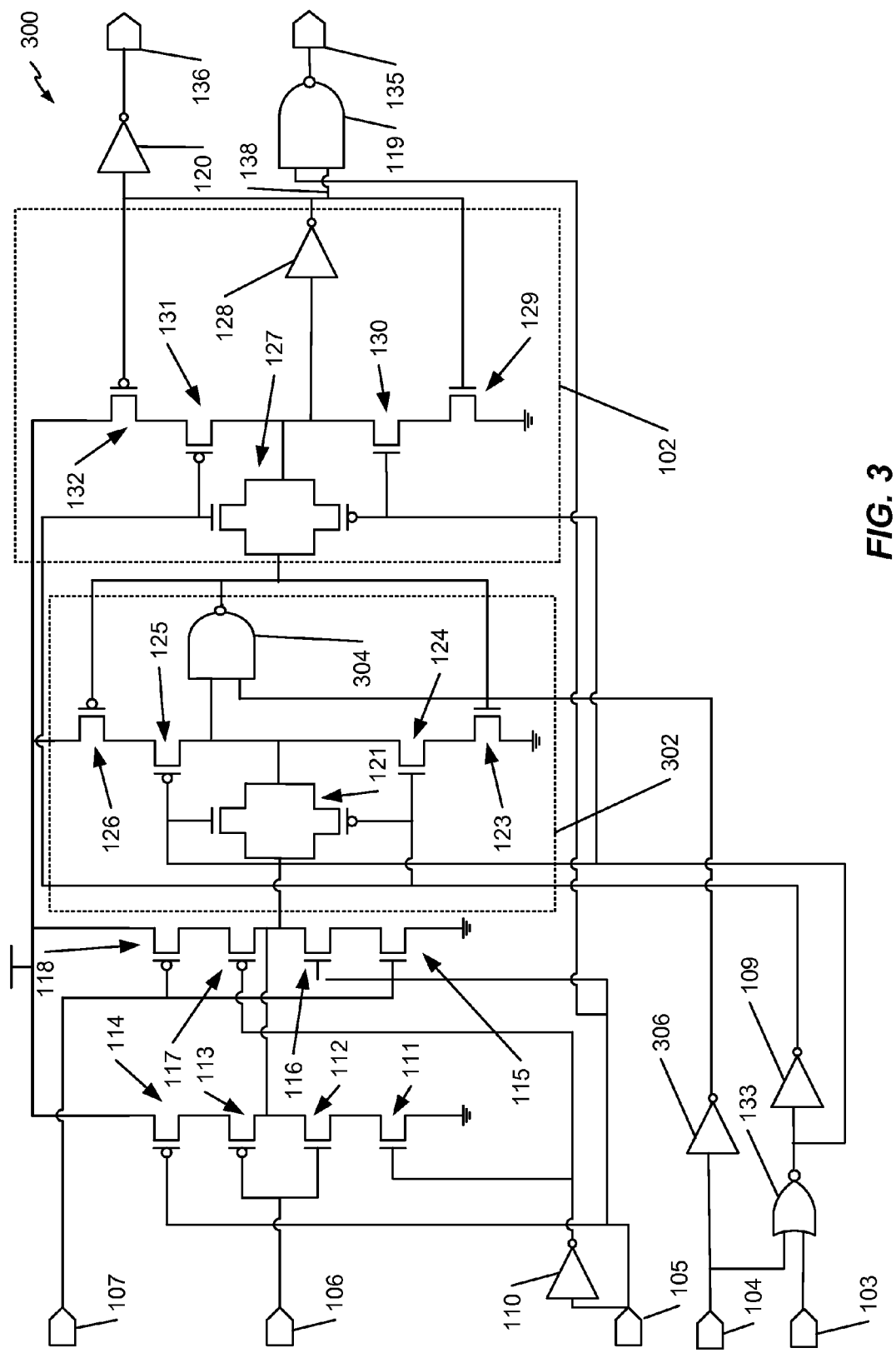
FIG. 3 is a logic diagram illustrating another particular embodiment of an asynchronous reset flip-flop.

FIG. 3 illustrates another particular embodiment of an asynchronous reset flip-flop 300. The asynchronous reset flip-flop 300 may include a master stage 302 and the slave stage 102 of FIG. 1. Compared to the asynchronous reset flip-flop 100 of FIG. 1, instead of the NOR logic gate 122 in the master stage 302, the master stage 302 includes a NAND logic gate 304. Also, the control signal 104 is a set signal instead of a reset signal. Accordingly, the asynchronous reset flip-flop 300 may operate in a set mode to set the output 138 of the slave stage 102 using the master stage 302. An inverter 306 may be coupled to the control signal 104. When the control signal 104 is a logic zero, the asynchronous reset flip-flop 300 may operate in the normal operation mode. When the control signal 104 is a logic one, an output of the NAND logic gate 304 may be a logic one. During the set mode, the slave stage is set by the master stage. The slave stage 102 may be set by the master stage 302 (via the pass gate 127) in a similar manner as described with respect to resetting the slave stage 102 of FIG. 1.

Figure 4:
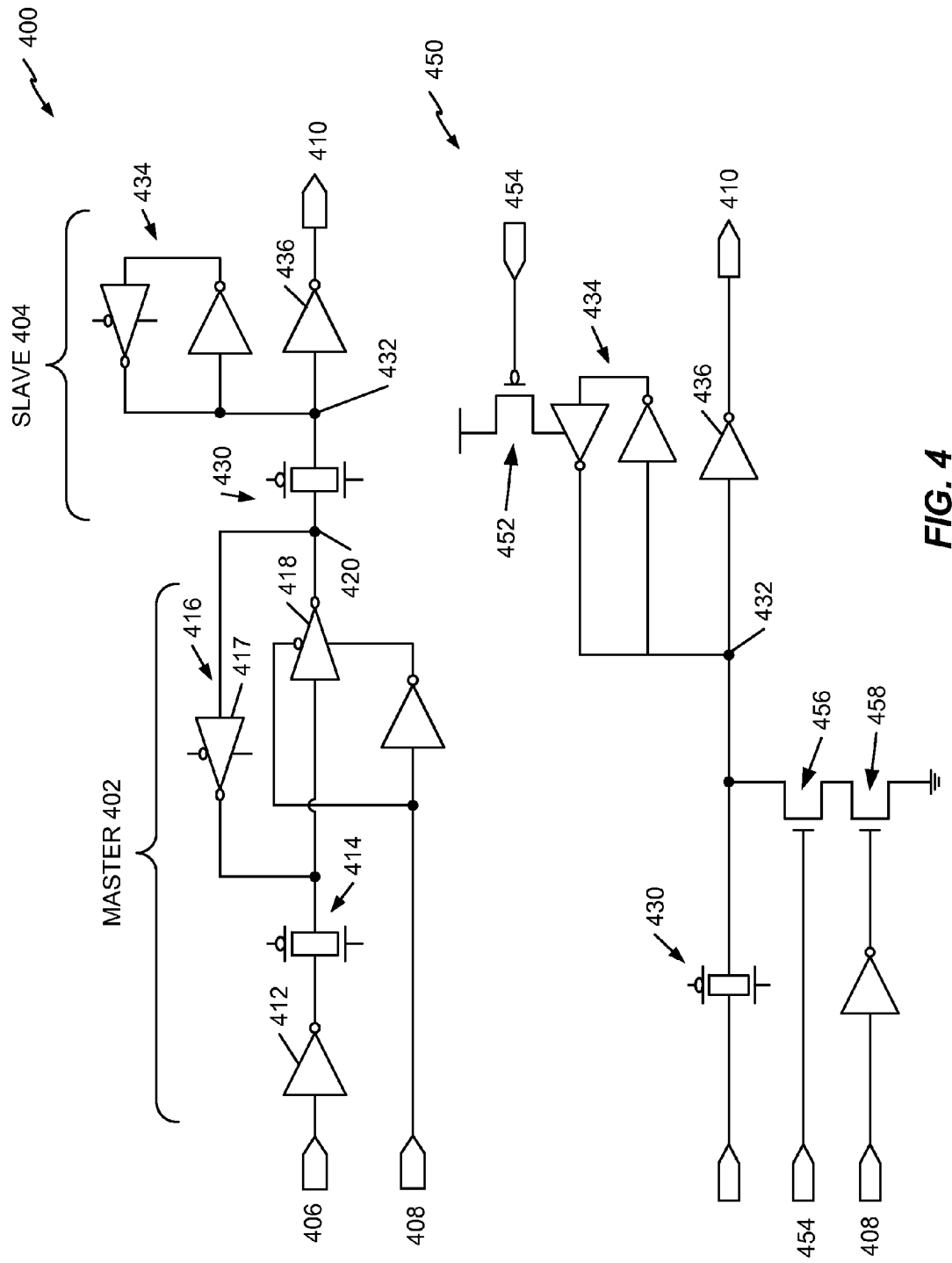
FIG. 4 is a logic diagram illustrating an embodiment of a flip-flop that is operable to provide a high-impedance output to an input of a slave stage of the flip-flop during a retention operation mode.

FIG. 4 illustrates a particular embodiment of a circuit 400 that is operable to provide a high-impedance output to an input of a slave stage 404 during a retention mode of operation. The asynchronous reset flip-flop 100 of FIG. 1, the asynchronous reset flip-flop 200 of FIG. 2, the asynchronous reset flip-flop 300 of FIG. 3, or a combination thereof may be implemented using the circuit 400.

The circuit 400 includes a master stage 402 and a slave stage 404. The circuit 400 may be in a single power domain. For example, the circuit 400 may be powered by a single power source (e.g., a single voltage source or a single current source). The master stage 402 may include an inverter 412 that is responsive to a data input 406 and that provides an input to a transmission gate 414. The transmission gate 414 may be coupled to a latch 416 formed from cross-coupled inverters 417, 418. An output of the inverter 418 may drive a voltage at a state node 420 of the master stage 402 and is provided as an input to the slave stage 404 during a normal operation mode. The slave stage 404 may include a transmission gate 430 coupled to an inverter 436. The inverter 436 may generate an output that is provided as an output 410 of the circuit 400. A keeper circuit 434 may hold a voltage at a node 432 that provides an input to the inverter 436. The keeper circuit 434 may include a pair of cross-coupled inverters.

The master stage 402 may be configured to provide a high-impedance output during a retention operation mode by electrically isolating the state node 420 from a power supply and from ground. For example, the high-impedance output may be generated via a tri-state element (e.g., a tri-state inverter 418) of the master stage 402 that is responsive to a retention operation mode control signal 408. Thus, paths to ground, the inputs to the inverter 436, an inverter of the keeper circuit 434 (due to CMOS gate impedance), and the output of the tri-state inverter 418 of the master stage 402 (via the transmission gate 430) may experience a high-impedance value during the retention operation mode. Current leakage at the node 432 may therefore be reduced as compared to a conventional synchronous reset flip-flop. Thus, a retention voltage needed to operate the slave stage 404 may be reduced during the retention operation mode.

In a particular embodiment, a slave stage 450 may include stacked pull-down transistors 456, 458. The transistor 456 may be responsive to a reset signal 454, and the transistor 458 may be responsive to a retention operation mode control signal 408. The keeper circuit 434 may be responsive to the reset signal 454 to tri-state an inverter of the keeper circuit 434 that drives the node 432 during a reset operation to reduce contention with the transistors 456, 458. Both of the transistors 456, 458 may be powered off during the retention operation mode. Thus, a leakage current associated with the node 432 may be reduced as compared to a conventional asynchronous reset flip-flop. Reducing a leakage current may reduce retention voltage of the circuit 400 during a retention operation mode. The slave stage 102 of FIG. 1 and FIG. 3, the slave stage 202 of FIG. 2, or a combination thereof may be implemented using the slave stage 450.

Figure 5:
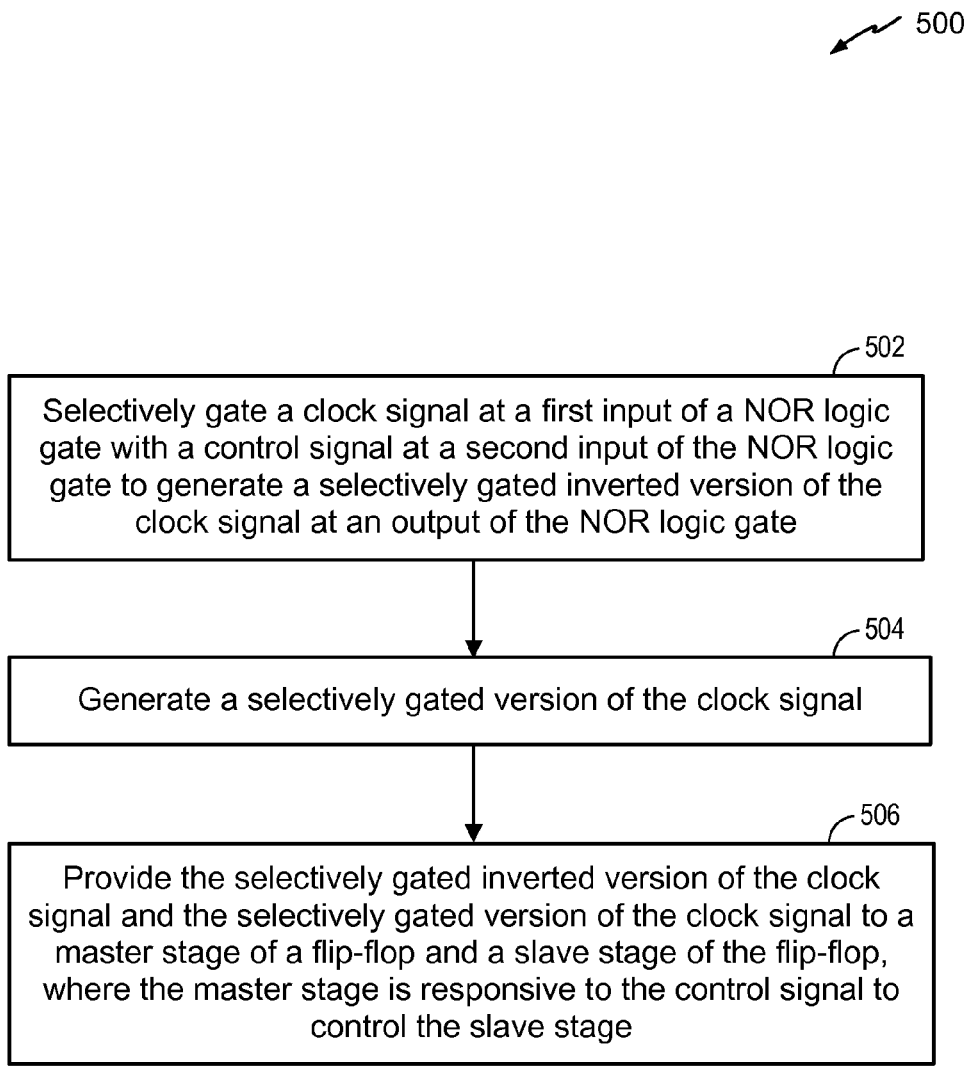
FIG. 5 is a flowchart illustrating a particular embodiment of a method of operation at an asynchronous reset flip-flop.

FIG. 5 illustrates a particular embodiment of a method 500 of operation at an asynchronous reset flip-flop. The method 500 includes selectively gating a clock signal at a first input of a NOR logic gate with a control signal at a second input of the NOR logic gate to generate a selectively gated inverted version of the clock signal at an output of the NOR logic gate, at 502. For example, referring to FIG. 1, the NOR logic gate 133 may be responsive to the clock signal 103 and to the control signal 104. The output of the NOR logic gate 133 may provide an inverted version of the clock signal 103.

The method 500 also includes generating a selectively gated version of the clock signal, at 504. For example, referring to FIG. 1, the inverter 109 may be responsive to the NOR logic gate 133 and may be configured to output a delayed version of the clock signal 103 (and that may be gated or enabled by the control signal 104). The method 500 further includes providing the selectively gated inverted version of the clock signal and the selectively gated version of the clock signal to a master stage of a flip-flop and a slave stage of the flip-flop, at 506. The master stage is responsive to the control signal to control the slave stage. For example, referring to FIG. 1, the output of the NOR logic gate 133 (e.g., an inverted version of the clock signal 103) and the delayed version of the clock signal 103 are provided to the master stage 101 and to the slave stage 102 of the asynchronous reset flip-flop 100. Thus, the method 500 may enable an asynchronous reset flip-flop to reduce leakage current as compared to a conventional asynchronous reset flip-flop. Reducing leakage current reduces power consumption of an asynchronous reset flip-flop.

Figure 6:
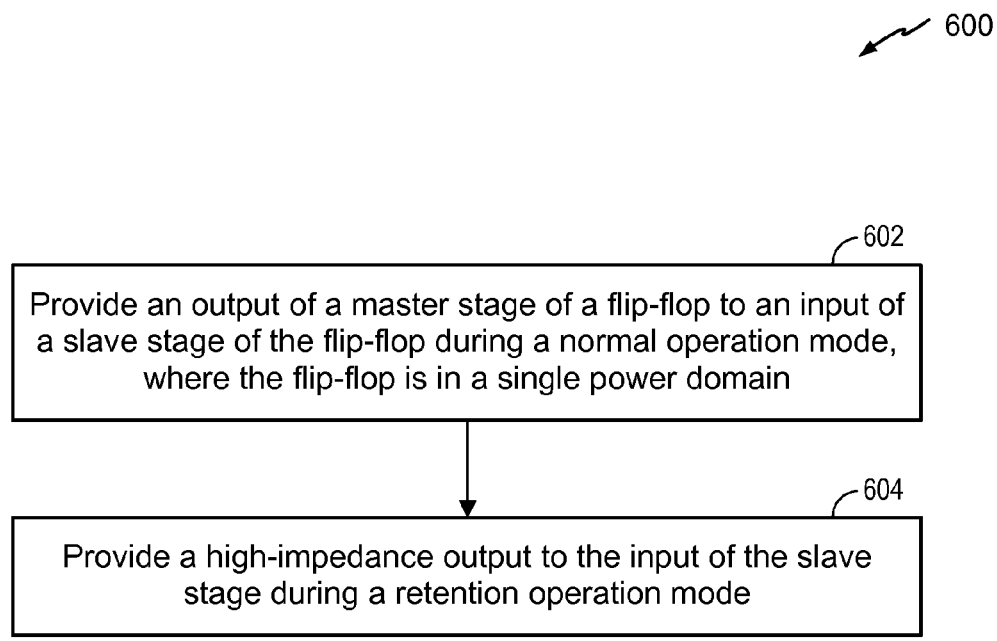
FIG. 6 is a flowchart illustrating another particular embodiment of a method of operation at an asynchronous reset flip-flop.

FIG. 6 illustrates a particular embodiment of a method 600 of operation at an asynchronous reset flip-flop. The method 600 includes providing an output of a master stage of a flip-flop to an input of a slave stage of the flip-flop during a normal operation mode, at 602. The flip-flop is in a single power domain. For example, referring to FIG. 4, the output of the inverter 418 may drive the voltage at the state node 420 of the master stage 402 and is provided as the input to the slave stage 404 during the normal operation mode. The method 600 also includes providing a high-impedance output to the input of the slave stage during a retention operation mode. For example, referring to FIG. 4, the master stage 402 may be configured to provide a high-impedance output during a retention operation mode by electrically isolating the state node 420 from a power supply and from ground via a tri-state element. Thus, the method 600 may enable an asynchronous reset flip-flop to reduce leakage current as compared to a conventional asynchronous reset flip-flop.

Figure 7:
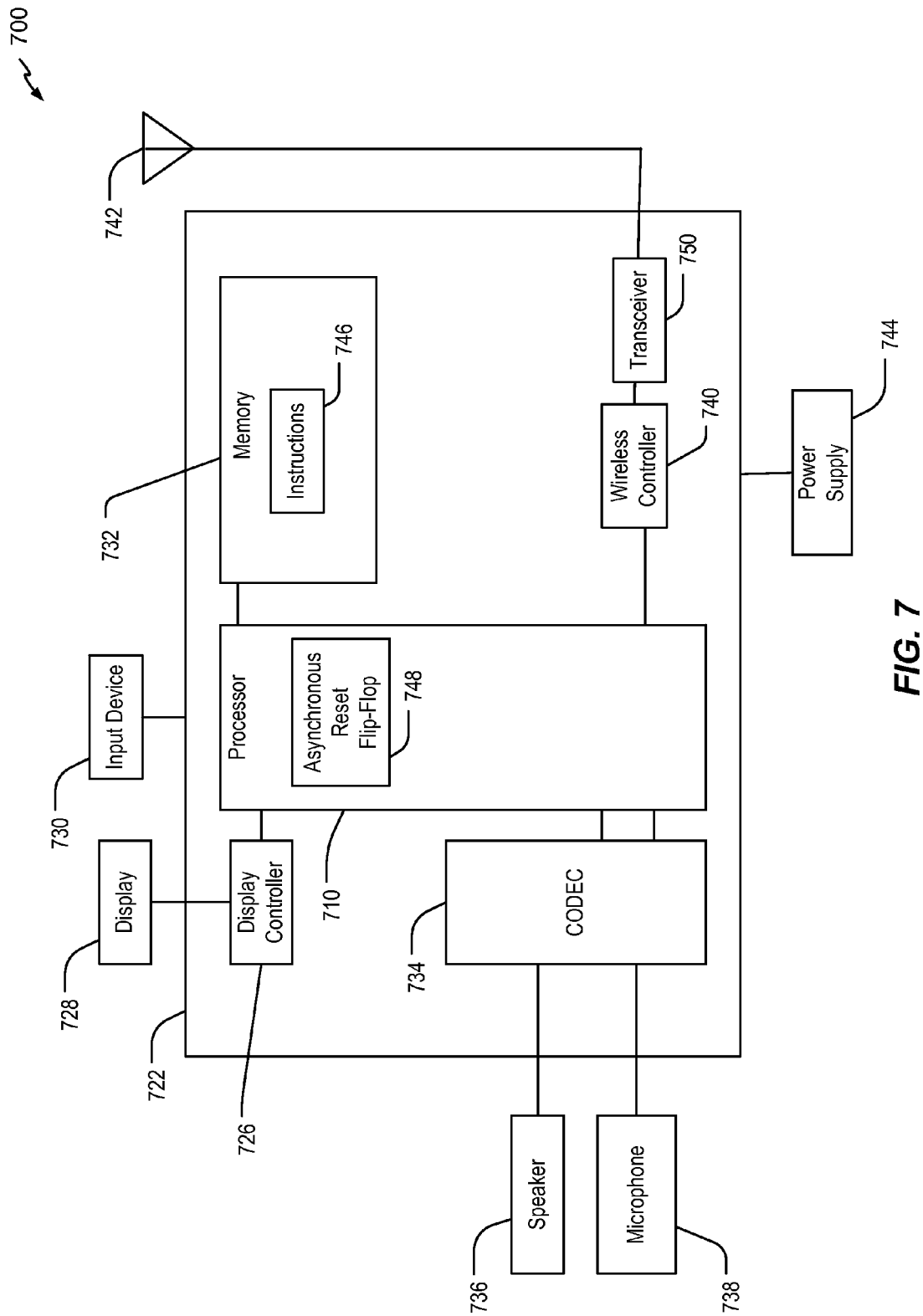
FIG. 7 is a block diagram of a communication device that includes one or more of the asynchronous reset flip-flop of FIGS. 1-4.

FIG. 7 is a block diagram of a communication device 700 includes an asynchronous reset flip-flop (e.g., one or more of the asynchronous reset flip-flops of FIGS. 1-3 and the circuit 400 of FIG. 4). The methods described in FIGS. 5-6, or certain portions thereof, may be performed at or by the communication device 700, (or by components thereof).

The communication device 700 includes a processor 710, such as a digital signal processor (DSP), coupled to a memory 732. The memory 732 may be a non-transitory tangible computer-readable and/or processor-readable storage device that stores instructions 746. The instructions 746 may be executable by the processor 710 to perform one or more functions or methods described herein, such as the methods described with reference to FIGS. 5-6.

FIG. 7 shows that the communication device 700 may also include a display controller 726 that is coupled to the processor 710 and to a display device 728. A coder/decoder (CODEC) 734 can also be coupled to the processor 710. A speaker 736 and a microphone 738 can be coupled to the CODEC 734. FIG. 7 also shows a wireless controller 740 coupled to the processor 710. The wireless controller 740 is in communication with an antenna 742 via a transceiver 750. The wireless controller 740, the transceiver 750, and the antenna 742 may represent a wireless interface that enables wireless communication by the communication device 700. The communication device 700 may include numerous wireless interfaces, where different wireless networks are configured to support different networking technologies or combinations of networking technologies (e.g., Bluetooth low energy, Near-field communication, Wi-Fi, cellular, etc.).

In a particular embodiment, the processor 710, the display controller 726, the memory 732, the CODEC 734, the wireless controller 740, and the transceiver 750 are included in a system-in-package or system-on-chip device 722. In a particular embodiment, an input device 730 and a power supply 744 are coupled to the system-on-chip device 722. Moreover, in a particular embodiment, as illustrated in FIG. 7, the display device 728, the input device 730, the speaker 736, the microphone 738, the antenna 742, and the power supply 744 are external to the system-on-chip device 722. However, each of the display device 728, the input device 730, the speaker 736, the microphone 738, the antenna 742, and the power supply 744 can be coupled to a component of the system-on-chip device 722, such as an interface or a controller.

The processor 710 may be implemented, at least in part, using asynchronous flip-flops, such as the illustrative asynchronous reset flip-flop 748. The asynchronous reset flip-flop 748 may be the asynchronous reset flip-flop 100 of FIG. 1, the asynchronous reset flip-flop 200 of FIG. 2, the asynchronous reset flip-flop 300 of FIG. 3, the circuit 400 of FIG. 4, or any combination thereof. The asynchronous reset flip-flop 748 may be used in circuits of one or more components of the communication device 700 to enable reduced power consumption during a retention operation mode while retaining a state of the asynchronous reset flip flop 748.

Although the processor 710 is described to be implemented, at least in part, using the asynchronous reset flip-flop 748, it should be understood that one or more of the display controller 726, the memory 732, the CODEC 734, and the wireless controller 740 may be implemented, at least in part, using asynchronous flip-flops, such as the illustrative asynchronous reset flip-flop 748.

In conjunction with the described embodiments, an apparatus may include means for performing a NOR logic operation responsive to a clock signal and responsive to a control signal. For example, referring to FIG. 1, the NOR logic gate 133 may be responsive to the clock signal 103 and to at the control signal 104. The apparatus may also include first means for storing data. For example, referring to FIG. 1, the asynchronous reset flip-flop 100 may include the master stage 101. The apparatus may further include second means for storing data that is responsive to the first means for storing data. For example, referring to FIG. 1, the asynchronous reset flip-flop 100 may include the slave stage 102 that may be responsive to the master stage 101.

The apparatus may further include means for inverting that is responsive to the means for performing a NOR logic operation. For example, referring to FIG. 1, the inverter 109 may be responsive to the NOR logic gate 133. The means for inverting is configured to output a delayed version of the clock signal. An output of the means for performing a NOR logic operation and the delayed version of the clock signal are provided to the first means for storing data and to the second means for storing data. The first means for storing data is responsive to the control signal to control the second means for storing data.

In a particular embodiment, the first means for storing data may include the master stage 402. The second means for storing data that is responsive to the first means for storing data may include the slave stage 404 that may be responsive to the master stage 402. The first means for storing data and the second means for storing data are in a single power domain. For example, referring to FIG. 4, the circuit 400 that includes the master stage 402 and the slave stage 404 may be powered by a single power source (e.g., a single voltage source or a single current source). The first means for storing data is configured to provide a high-impedance output to an input of the second means for storing data during a retention operation mode. For example, referring to FIG. 4, the master stage 402 may be configured to provide a high-impedance output during a retention operation mode by electrically isolating the state node 420 from a power supply and from ground.

One or more of the disclosed embodiments may be implemented in a system or an apparatus that includes a portable music player, a personal digital assistant (PDA), a mobile location data unit, a mobile phone, a cellular phone, a computer, a tablet, a portable digital video player, or a portable computer. Additionally, the system or the apparatus may include a communications device, a fixed location data unit, a set top box, an entertainment unit, a navigation device, a monitor, a computer monitor, a television, a tuner, a radio, a satellite radio, a music player, a digital music player, a video player, a digital video player, a digital video disc (DVD) player, a desktop computer, any other device that stores or retrieves data or computer instructions, or a combination thereof. As another illustrative, non-limiting example, the system or the apparatus may include remote units, such as global positioning system (GPS) enabled devices, navigation devices, fixed location data units such as meter reading equipment, or any other electronic device. Although one or more of FIGS. 1-5 illustrate systems, apparatuses, and/or methods according to the teachings of the disclosure, the disclosure is not limited to these illustrated systems, apparatuses, and/or methods. Embodiments of the disclosure may be employed in any device that includes circuitry.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed or that the first element must precede the second element in some manner. Also, unless stated otherwise a set of elements may comprise one or more elements.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

Various illustrative components, blocks, configurations, modules, circuits, and steps have been described above generally in terms of their functionality. Whether such functionality is implemented as hardware or processor executable instructions depends upon the particular application and design constraints imposed on the overall system. Additionally, the various operations of methods described above (e.g., any operation illustrated in FIGS. 5-6) may be performed by any suitable means capable of performing the operations, such as various hardware and/or software component(s), circuits, and/or module(s). Skilled artisans may implement the described functionality in varying ways for each particular application, but such implementation decisions should not be interpreted as causing a departure from the scope of the present disclosure.

Those of skill in the art would further appreciate that the various illustrative logical blocks, configurations, modules, circuits, and algorithm steps described in connection with the present disclosure may be implemented or performed with a general purpose processor, a digital signal processor (DSP), an application specific integrated circuit (ASIC), a field programmable gate array (FPGA), a programmable logic device (PLD), discrete gate or transistor logic, discrete hardware components (e.g., electronic hardware), computer software executed by a processor, or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored as one or more instructions or code on a computer-readable medium. Computer-readable media includes computer readable storage media and communication media including any medium that facilitates transfer of computer program data from one place to another. A storage media may be any available media that can be accessed by a computer. By way of example, and not limitation, such computer readable storage media can include random access memory (RAM), read-only memory (ROM), programmable read-only memory (PROM), erasable PROM (EPROM), electrically erasable PROM (EEPROM), register(s), hard disk, a removable disk, a compact disc read-only memory (CD-ROM), other optical disk storage, magnetic disk storage, magnetic storage devices, or any other medium that can be used to store program code in the form of instructions or data and that can be accessed by a computer. In the alternative, the computer-readable media (e.g., a storage medium) may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and floppy disk where disks usually reproduce data magnetically, while discs reproduce data optically with lasers. Thus, in some aspects computer readable medium may include a non-transitory computer readable medium (e.g., tangible media). Combinations of the above should also be included within the scope of computer-readable media.

The methods disclosed herein include one or more steps or actions. The method steps and/or actions may be interchanged with one another without departing from the scope of the claims. In other words, unless a specific order of steps or actions is specified, the order and/or use of specific steps and/or actions may be modified without departing from the scope of the disclosure.

Certain aspects may include a computer program product for performing the operations presented herein. For example, a computer program product may include a computer-readable storage medium having instructions stored (and/or encoded) thereon, the instructions being executable by one or more processors to perform the operations described herein. The computer program product may include packaging material.

Further, it should be appreciated that modules and/or other appropriate means for performing the methods and techniques described herein can be downloaded and/or otherwise obtained by a user terminal and/or base station as applicable. Alternatively, various methods described herein can be provided via storage means (e.g., RAM, ROM, or a physical storage medium such as a compact disc (CD)). Moreover, any other suitable technique for providing the methods and techniques described herein can be utilized. It is to be understood that the scope of the disclosure is not limited to the precise configuration and components illustrated above.

The previous description of the disclosed embodiments is provided to enable a person skilled in the art to make or use the disclosed embodiments. While the foregoing is directed to aspects of the present disclosure, other aspects of the disclosure may be devised without departing from the basic scope thereof, and the scope is determined by the claims that follow. Various modifications, changes and variations may be made in the arrangement, operation, and details of the embodiments described herein without departing from the scope of the disclosure or the claims. Thus, the present disclosure is not intended to be limited to the embodiments herein but is to be accorded the widest scope possible consistent with the principles and novel features as defined by the following claims and equivalents thereof.

What is claimed is:

1. A circuit comprising:
   a master stage of a flip-flop having a data input gated by a first transmission gate, the master stage further including a logic gate for driving a master stage output; and
   a slave stage of the flip-flop having an input coupled to the master stage output by a second transmission gate;
   wherein the first transmission gate is configured to be opened responsive to an assertion of a control signal signal, and wherein the second transmission gate is configured to be closed responsive to the assertion of the control signal, and wherein the logic gate is responsive to the assertion of the control signal to control a mode for the flip-flop selected from the set consisting of a set mode and a reset mode.

2. The circuit of claim 1, wherein the control signal comprises a reset signal, and wherein the logic gate comprises a NOR gate.

3. The circuit of claim 1, wherein the master stage is responsive to the control signal and wherein the slave stage is isolated from the control signal.

4. The circuit of claim 1, wherein the control signal is configured to be provided to multiple flip-flop circuits.

5. The circuit of claim 1, wherein the slave stage comprises an inverter, and wherein an input of the inverter is coupled to two serially coupled pull-up transistors.

6. The circuit of claim 5, wherein the input of the inverter is further coupled to two serially coupled pull-down transistors, and wherein a width of the two serially coupled pull-up transistors is larger than a width of the two serially coupled pull-down transistors.

7. The circuit of claim 6, wherein the width of the two serially coupled pull-down transistors is approximately equal to a minimum width permitted by a fabrication rule.

8. The circuit of claim 1, wherein the control signal comprises a set signal, and wherein the logic gate comprises a NAND gate.

9. A circuit comprising:
a master stage of a flip-flop; and
a slave stage of the flip-flop, the slave stage responsive to the master stage,
wherein the flip-flop is in a single power domain, and wherein the master stage is configured to provide a high-impedance output through a tri-state inverter to an input of the slave stage during a retention operation mode by electrically isolating a state node of the master stage from a power supply and from ground, wherein the flip-flop is powered by a supply voltage of the single power domain during a normal operation mode, and wherein the supply voltage is lowered to a retention voltage in the single power domain during the retention operation mode.

10. The circuit of claim 9, wherein the tri-state inverter is responsive to a retention operation mode control signal.

11. The circuit of claim 9, wherein the flip-flop comprises no more than two transmission gates.

12. A method comprising:
asserting a control signal;
opening a first transmission gate in a master stage of a flip-flop responsive to the assertion of the control signal to isolate the master stage from a data input;
closing a second transmission gate in a slave stage of the flip-flop responsive to the assertion of the control signal so that that second transmission gate latches an output of the master stage; and
processing the asserted control signal in a logic gate configured to control the output of the master stage to control a mode for the flip-flop selected from the group consisting of a set mode and a reset mode.

13. The method of claim 12, asserting the control signal comprises asserting a reset signal, and wherein processing the asserting control signal in a logic gate comprises NORing the asserted reset signal.

14. The method of claim 13, wherein the slave stage is isolated from the reset signal.

15. The method of claim 12, wherein the output of the NOR logic gate is configured to be provided to multiple flip-flop circuits.

16. The method of claim 12, wherein the slave stage comprises an inverter, and wherein an input of the inverter is coupled to two serially coupled pull-up transistors.

17. The method of claim 16, wherein the inverter is configured to generate an output of the slave stage.

18. The method of claim 16, wherein the inverter is further coupled to two serially coupled pull-down transistors, and wherein a width of the two serially coupled pull-up transistors is larger than a width of the two serially coupled pull-down transistors.

19. The method of claim 18, wherein the width of the two serially coupled pull-down transistors is approximately equal to a minimum width permitted by a fabrication rule.

20. The method of claim 12, wherein asserting the control signal comprises asserting a set signal, and wherein processing the asserting control signal in a logic gate comprises NANDing the asserted set signal in a NAND logic gate.

21. The method of claim 20, wherein the NAND logic gate is configured to function as an inverter during an operation mode and to perform a reset function during a reset mode.

22. The method of claim 12, wherein the control signal includes a set signal, wherein the master stage is responsive to the set signal to set the master stage during a set mode, and wherein the master stage is configured to set the slave stage during the set mode.

23. A method comprising:
providing an output of a master stage of a flip-flop to an input of a slave stage of the flip-flop during an operation mode, wherein the flip-flop is in a single power domain; and
providing a high-impedance output from a tri-state inverter in the master stage to the input of the slave stage during a retention mode, wherein the flip-flop is configured to be powered by a supply voltage of the single power domain during a normal operation mode, and wherein the supply voltage is lowered to a retention voltage during the retention operation mode.

24. The method of claim 23, wherein the master stage is configured to provide the high-impedance output by electrically isolating a state node of the master stage from a power supply and from ground.

25. The method of claim 23, wherein the tri-state inverter is responsive to a retention operation mode control signal.

26. The method of claim 23, wherein the flip-flop comprises no more than two transmission gates.

* * * * *